US006094067A

United States Patent [19]

Taniguchi

[11] Patent Number: 6,094,067

[45] Date of Patent: Jul. 25, 2000

[54] OUTPUT BUFFER CIRCUIT

[75] Inventor: Hideki Taniguchi, Tokyo, Japan

[73] Assignee: Mitsubishi Denki Kabushiki Kaisha, Tokyo, Japan

[21] Appl. No.: 08/931,305

[22] Filed: Sep. 16, 1997

[30] Foreign Application Priority Data

Apr. 8, 1997 [JP] Japan .................................... 9-089798

[51] Int. Cl.[7] ................................................ H03K 19/0175

[52] U.S. Cl. ................................ 326/81; 326/68; 326/58

[58] Field of Search ................................ 326/81, 57, 27, 326/83, 86, 58, 56, 80, 68, 26, 121

[56] References Cited

U.S. PATENT DOCUMENTS

| | | | |
|---|---|---|---|
| 4,506,164 | 3/1985 | Higuchi | 326/81 |
| 5,300,835 | 4/1994 | Assar et al. | 326/68 |
| 5,422,592 | 6/1995 | Asahina | 327/427 |
| 5,534,795 | 7/1996 | Wert et al. | 326/81 |
| 5,670,894 | 9/1997 | Takaishi et al. | 326/27 |
| 5,748,011 | 5/1998 | Takaishi et al. | 326/83 |
| 5,834,948 | 11/1998 | Yoshizaki et al. | 326/81 |

FOREIGN PATENT DOCUMENTS

| | | | |
|---|---|---|---|
| 3-53715 | 3/1991 | Japan . | |
| 404004609 | 1/1992 | Japan | 326/27 |
| 404315316 | 11/1992 | Japan | 326/27 |
| 5-36919 | 2/1993 | Japan . | |
| 5-335504 | 12/1993 | Japan . | |

*Primary Examiner*—Michael Tokar
*Assistant Examiner*—Daniel D. Chang
*Attorney, Agent, or Firm*—Burns, Doane, Swecker & Mathis, LLP

[57] ABSTRACT

An output buffer circuit is provided which comprises a level conversion circuit having a first conversion circuit for converting a control signal and an output signal to "H" and "L" signals in a first source system and a second conversion circuit for converting these into "H" and "L" signals in a second source system, a tristate control type input/output control circuit for computing the "H" and "L" signals outputted from the second conversion circuit in the second source system, and a push-pull circuit having MOS transistors Q13*a* and Q14, which is activated in the second source system in response to the "H" and "L" signals so as to select a tristate and output it as an input/output signal.

10 Claims, 7 Drawing Sheets

ELECTROSTATIC PROTECTION CIRCUIT
INPUT BUFFER
INTERNAL CIRCUIT
VDD1
VDD2
IN1
IN2

ELECTROSTATIC PROTECTION CIRCUIT
12
1
13
Q13b
10c
9b
N9
N10
Q14
G10
G8
G6
G9
G7
N7
N8
G5
G4
7b
INPUT BUFFER
11
N5
N6
8b
8
VDD2
VDD1
Q5
Q6
Q11
Q12
N3
N4
Q4
Q10
Q3
Q9
Q1
Q2
Q7
Q8
N1
N2
8a
IN1
IN2
2
3
INTERNAL CIRCUIT

ELECTROSTATIC PROTECTION CIRCUIT
12
1
13
Q13b
10d
5
6
N9
N10
Q14
9c
G10
G8
G9
G6
G7
N7
N8
11
INPUT BUFFER
G5
G4
7a
G3
N5
N6
8b
Q5
Q6
Q11
Q12
8
VDD2
N3
N4
Q4
Q10
Q3
Q9
VDD1
Q1
Q2
Q7
Q8
N1
N2
4
8a
IN1
2
IN2
3
INTERNAL CIRCUIT

ELECTROSTATIC PROTECTION CIRCUIT
12
1
10e
13
Q13a
5
6
Q14
N17
N18
9d
G10
G11
G8
G9
G6
G7
N15
N16
8b
8
VDD2
VDD1
Q5
Q6
Q12
Q11
N13
N14
Q4
Q3
Q11
Q9
4
Q1
N11
Q2
Q7
N12
Q8
8a
G4
G5
7c
G3
G1
G2
IN1
2
IN2
3
INPUT BUFFER
11
INTERNAL CIRCUIT

ELECTROSTATIC PROTECTION CIRCUIT
INPUT BUFFER
INTERNAL CIRCUIT
VDD1
VDD2
IN1
IN2

OUTPUT BUFFER CIRCUIT

BACKGROUND OF THE INVENTION

1. Field of the Invention

This invention relates to an output buffer circuit having the function of converting signals into signal voltage levels between different source voltages.

2. Description of the Prior Art

FIG. 5 is a circuit diagram showing a configuration of a conventional output buffer circuit described in, for example, JP-A-7-176084 and is a circuit diagram illustrating a configuration of an input/output circuit of a semiconductor integrated circuit device having a signal level converting function. When an internal signal level is converted from a low voltage to a high voltage, an output buffer of an interface circuit used between semiconductor integrated circuit devices activated at different source voltages makes use of a half-latch type level conversion circuit shown in the drawing and takes a push-pull type output configuration. Incidentally, the semiconductor integrated circuit device having the signal level converting function means one having the function of by-level converting a signal voltage supplied from a device activated at a source voltage inside a large-scale integrated (LSI) circuit into a signal voltage and outputting it to an external circuit activated at a source voltage different from the source voltage for the internal circuit and the function of by-level converting signals supplied from devices activated at external and different source voltages to signal voltages for the internal circuit and transmitting the same to the inside.

In the drawing, reference numeral 7*c* indicates an input/output control circuit, reference numeral 8 indicates a signal level conversion circuit and reference numeral 9*d* indicates a buffer circuit. These constitutes an output buffer circuit 10*e*. Incidentally, a final stage of the buffer circuit 9*d* constitutes a push-pull circuit 13 composed of a PMOS transistor Q13*a* and an NMOS transistor Q14. The final stage configures a CMOS (Complementary Metal Oxide Semiconductor) push-pull buffer. Reference numeral 1 indicates an input/output terminal, reference numeral 2 indicates a control terminal, reference numeral 3 indicates an input terminal, reference numeral 11 indicates an input buffer and reference numeral 12 indicates an electrostatic protection circuit. These components designated at numerals 1, 2, 3, 10*e*, 11 and 12 constitute the aforementioned input/output circuit of semiconductor integrated circuit device.

An internal circuit is electrically connected to the input/output terminal 1 through the input buffer 11. Further, a control terminal 2 for receiving a control signal IN1 outputted from the internal circuit and an input terminal 3 for receiving a control signal IN2 outputted from the internal circuit are electrically connected to the input/output terminal 1 through the output buffer circuit 10*e*. Further, the control terminal 2 and the input terminal 3 are electrically connected to the input/output control circuit 7*c*. The input/output control circuit 7*c* outputs the signals to the signal level conversion circuit 8, and the signal level conversion circuit 8 outputs signals to the buffer circuit 9*d* through connecting points N15 and N16.

The input/output control circuit 7*c* and the former half 8*a* of the signal level conversion circuit 8 are activated by being supplied with a first source voltage $V_{DD1}$ corresponding to a source voltage of the internal circuit and a ground potential GND. On the other hand, the latter half 8*b* of the signal level conversion circuit 8 and the buffer circuit 9*d* are activated by being supplied with a second source $V_{DD2}$ higher than the first source voltage $V_{DD1}$ and the ground potential GND. Incidentally, the first source voltage $V_{DD1}$ and the second source voltage $V_{DD2}$ are supplied from source potential points 4 and 5 respectively and the ground potential GND is supplied from each ground potential point 6.

The operation will next be described.

When the control signal IN1 is of a "H" level (High Level), the connecting points N15 and N16 are respectively brought to an "L" level (ground potential GND) and an "H" level (second source voltage $V_{DD2}$) by the signal level conversion circuit 8 even if the output signal IN2 is of an "L" level (Low Level) or the "H" level. Correspondingly, the first signal from the connecting point N15 and the second signal from the connecting point N16 are transmitted via inverter gates G6, G8 and G10, and G7, G9 and G11 of odd-numbered stages, respectively. Therefore, connecting points N17 and N18 are brought to an "H" level and an "L" level respectively. Thus, the gates of the transistors Q13*a* and Q14 are supplied with signal voltages of the "H" and "L" levels. As a result, both the transistors Q13*a* and Q14 of the buffer circuit 9*d* are turned off so that the buffer circuit 9*d* is brought to a high impedance state with respect to the input/output terminal 1. Thus, the external signal supplied to the input/output terminal 1 is transmitted to the input buffer 11 without its impairment.

On the other hand, when the control signal IN1 is of the "L" level and the output signal IN2 is of the "L" level, the connecting points N15 and N16 are both brought to the "L" level by the signal level conversion circuit 8. In response to this, the transistors Q13*a* and Q14 of the buffer circuit 9*d* are turned off and on respectively so that the "L" level is outputted to the input/output terminal 1.

When the control signal IN1 is "L" in level and the output signal IN2 is "H" in level, the connecting points N15 and N16 are both rendered "H" in level by the signal level conversion circuit 8. In response to this, the transistors Q13*a* and Q14 of the buffer circuit 9*d* are turned on and off respectively so that the "H" level is outputted to the input/output terminal 1.

FIG. 6 is another circuit diagram illustrating a configuration of a conventional output buffer circuit and shows a configuration of an input/output circuit of a semiconductor integrated circuit device having a signal level converting function similar to that shown in FIG. 5. The circuit configuration shown in FIG. 6 is one in which the buffer circuit 9*d* shown in FIG. 5 is replaced by a buffer circuit 9*e*. The circuit configuration shown in FIG. 6 is different from that shown in FIG. 5 in that an inverter gate G12 is additionally provided subsequent to an inverter gate G10 and the PMOS transistor Q13*a* constituting the push-pull circuit 13 corresponding to the final stage is replaced by an NMOS transistor Q13*b*. Since other configurations are similar to those shown in FIG. 5, the same parts as those shown in FIG. 5 are identified by like reference numerals and the description of certain common parts will be omitted. Even if such a configuration is adopted, the operation described with reference to FIG. 5 can be performed. Namely, since the NMOS transistor Q13*b* works in reverse with respect to the PMOS transistor Q13*a* although a signal level outputted from the inverter gate G10 is inverted by the additionally-provided inverter gate G12, the same logical operation as that shown in FIG. 5 is eventually performed even in the case of the circuit configuration of FIG. 6.

FIGS. 7 and 8 are respectively configurational cross-sectional views of respective pairs of MOS transistors which constitute push-pull circuits corresponding to final stages of conventional output buffers. FIG. 7 is a configurational cross-sectional view of the MOS transistors Q13*a* and Q14 constituting the push-pull circuit of the buffer circuit 9*d*. They are PMOS and NMOS types. On the other hand, FIG. 8 is a configurational cross-sectional view of the MOS transistors Q13*b* and Q14 constituting the push-pull circuit of the buffer circuit 9*e*. Both transistors are of NMOS types.

SUMMARY OF THE INVENTION

The conventional output buffer circuit having the signal level converting function is constructed as described above. When the proper output operation of the output buffer circuit is being performed, a combination of the potentials at the connecting points N15 and N16 results in any of ("H" level and "H" level), ("L" level and "L" level) and ("L" level and "H" level).

However, when the first source voltage $V_{DD1}$ is not turned on in an initial state in which the second source voltage $V_{DD2}$ has been turned on, the values of the respective portions in the signal level conversion circuit 8 are not defined unequivocally. There is a probability that the combination of the potentials at the connecting points N15 and N16 will be ("H" level and "L" level) in FIG. 5, for example. A problem arises in that this state results in a situation in which the pair of MOS transistors Q13*a* and Q14 (Q13*b* and Q14 in FIG. 6) are both simultaneously turned on and hence an unnecessary current (through current) flows between the source potential point 5 and the ground potential point 6 in the buffer circuit 9*d* (9*e* in FIG. 6).

With the foregoing problem in view, it is therefore an object of the present invention to provide an output buffer circuit having a circuit configuration for avoiding logic that through currents flow in transistors constituting a push-pull circuit corresponding to a final stage of an output buffer.

According to a first aspect of the present invention, there is provided an output buffer circuit comprising:

a conversion circuit having first converting means for inputting a first potential and a second potential therein and converting the same into first and second signals based on binary logic in a first source voltage system, and second converting means for inputting the first and second signals therein and converting these signals into signal voltage levels corresponding to a second source voltage system;

a tristate control type logic circuit for computing the first and second signals outputted from the second converting means in the second source voltage system; and a push-pull circuit having field-effect transistors, the push-pull circuit being activated in the second source voltage system in response to the first and second signals outputted from the logic circuit so as to select and output any of three states.

According to a second aspect of the present invention, the tristate control type logic circuit comprises an inverter gate, a NAND gate and a NOR gate.

According to a third aspect of the present invention, there is provided an output buffer circuit comprising:

a conversion circuit having first converting means for inputting a first potential and a second potential therein and converting the same into first and second signals based on binary logic in a first source voltage system, and second converting means for inputting the first and second signals therein and converting these signals into signal voltage levels corresponding to a second source voltage system;

a tristate control type logic circuit for computing the first and second signals outputted from the first and second converting means in the second source voltage system; and a push-pull circuit having field-effect transistors, said push-pull circuit being activated in the second source voltage system in response to the first and second signals outputted from the logic circuit so as to select and output any of three states.

According to a fourth aspect of the present invention, the tristate control type logic circuit comprises a NAND gate and a NOR gate.

According to a fifth aspect of the present invention, the second converting means performs an operation based on the binary logic.

According to a sixth aspect of the present invention, the push-pull circuit has an output final stage composed of a PMOS transistor and an NMOS transistor.

According to a seventh aspect of the present invention, the push-pull circuit has an output final stage composed of two NMOS transistors.

According to the first aspect of the present invention, as has been described above, the first converting means inputs the first and second potentials therein and converts them to the first and second signals based on the binary logic in the first source voltage system, respectively. The second converting means inputs the first and second signals therein and converts these signals to their voltage levels in the second source voltage system. The logic circuit of the tristate control type performs an arithmetic operation on the first and second signals outputted after their conversion. Further, the push-pull buffers of the output final stage in the buffer circuit are activated in response to its logic. Therefore, even if the signals placed in the logical states in which the through currents flow in the field-effect transistors constituting the push-pull buffers of the output final stage, are outputted from the level conversion circuit, the tristate control type logic circuit avoids their logical states beforehand. Thus, the output buffer circuit of the present invention brings about an advantageous effect in that the through currents flowing in the field-effect transistors of the output final stage can be avoided and hence power consumption can be reduced.

According to the second aspect, an advantageous effect is brought about in that since the tristate control type logic circuit is constructed so as to have the inverter gate, NAND gate and NOR gate, the logical states in which the push-pull buffers of the output final stage in the next-stage buffer circuit are both turned on so that the through currents flow, can be avoided.

According to the third aspect, the first converting means inputs the first and second potentials therein and converts them to the first and second signals based on the binary logic in the first source voltage system, respectively. The second converting means inputs the first and second signals therein and converts these signals to their voltage levels in the second source voltage system. The logic circuit of the tristate control type performs an arithmetic operation on the first and second signals outputted from the first and second converting means. Further, the push-pull buffers of the output final stage in the buffer circuit are activated in response to its logic. Therefore, even if the signals placed in the logical states in which the through currents flow in the field-effect transistors constituting the push-pull buffers of the output final stage, are outputted from the level conversion circuit, the tristate control type logic circuit avoids their logical states beforehand. Further, since input terminals of the logic circuit can be directly connected to the outputs of the first converting means, the number of component elements can be reduced and this contributes to a reduction in power consumption. Thus, the output buffer circuit of the present invention brings about an advantageous effect in that the through currents flowing in the field-effect transistors of the output final stage can be avoided and hence power consumption can be reduced.

According to the fourth aspect, an advantageous effect is brought about in that since the tristate control type logic circuit is configured so as to have the NAND gate and the NOR gate, the logical states in which if the first or second signal corresponding to the output of the first converting means is inputted to a first input terminal of the NOR gate, then the push-pull buffers of the output final stage in the next-stage buffer circuit are both turned on so that the through currents flow, can be avoided.

According to the fifth aspect, an advantageous effect is brought about in that since the second converting means performs an arithmetic operation based on the binary logic and a latch circuit using the field-effect transistors is provided, currents can be controlled so as not to flow between the first source system and the second source system at points where the first converting means and the second converting means are connected, thereby making it possible to block the through currents that flow in the transistors of the push-pull circuit constituting the second converting means.

According to the sixth aspect, an advantageous effect is brought about in that since the output final stage in the output buffer circuit comprises the PMOS transistor and the NMOS transistor, it can constitute a CMOS push-pull circuit.

According to the seventh aspect, an advantageous effect is brought about in that since the output final stage in the output buffer circuit comprises the two NMOS transistors, it can constitute an NMOS-NMOS push-pull circuit.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The present invention will now be described with reference to the accompanying drawings wherein.

DETAILED DESCRIPTION OF THE PREFERRED EMBODIMENTS

Preferred embodiments of the present invention will hereinafter be described in detail with reference to the accompanying drawings.

First Embodiment

Figure 1:
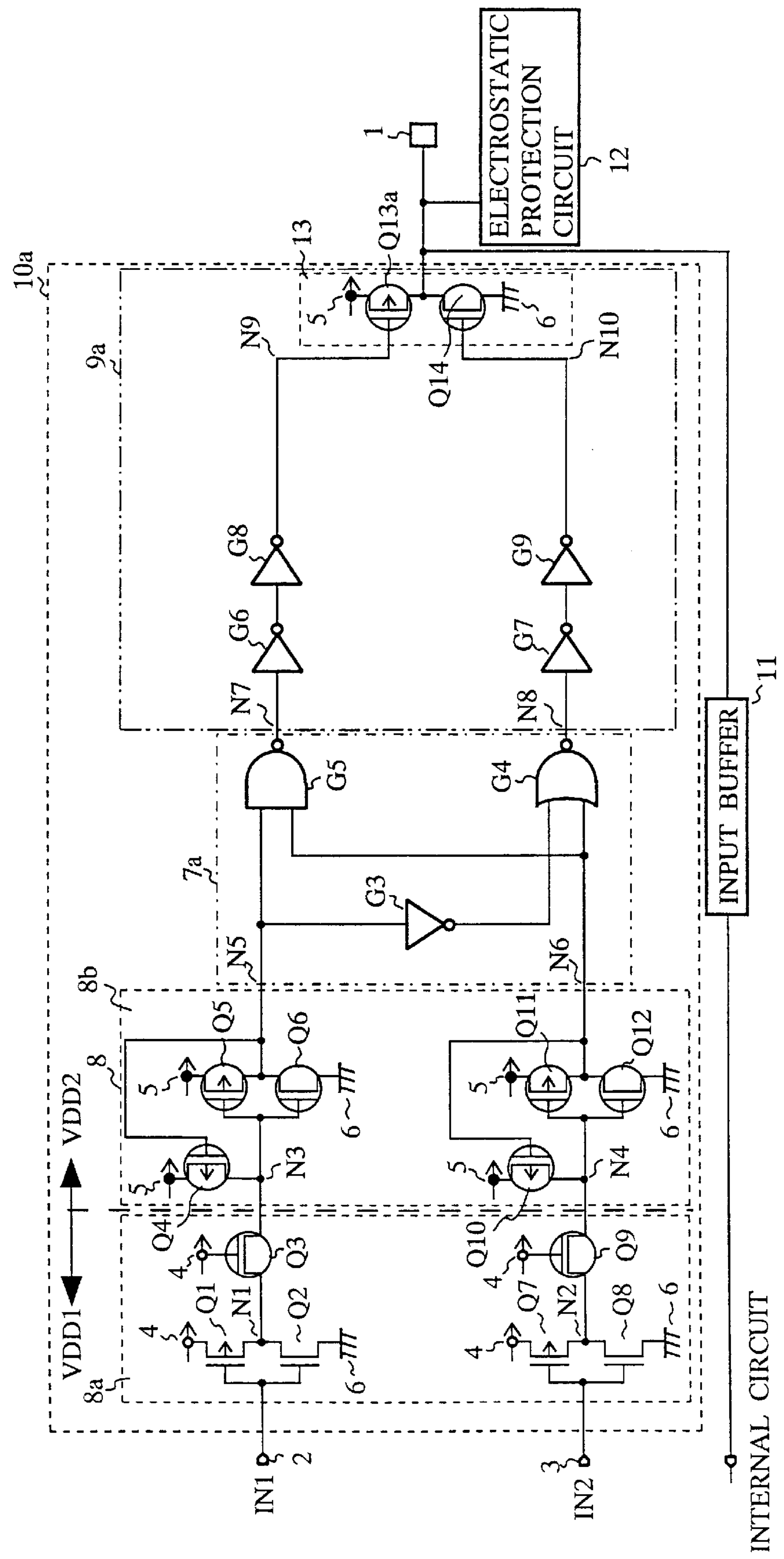
FIG. 1 is a circuit block diagram showing an output buffer circuit according to a first embodiment of the present invention.

FIG. 1 is a circuit diagram showing a configuration of an output buffer circuit according to a first embodiment and illustrates a configuration of an input/output circuit of a semiconductor integrated circuit device having a signal level converting function.

In the drawing, reference numeral 7*a* indicates an input/output control circuit used as a logic circuit, reference numeral 8 indicates a signal level conversion circuit used as a conversion circuit, reference numeral 8*a* indicates a first conversion circuit used as a first converting means, reference numeral 8*b* indicates a second conversion circuit used as a second converting means, reference numeral 9*a* indicates a buffer circuit, reference numeral 13 indicates a push-pull circuit, and reference numerals Q13*a* and Q14 indicate MOS transistors which constitute the output buffer final stage and are respectively PMOS and NMOS types. These constitute an output buffer circuit 10*a*. Reference numerals 1, 2, 3, 11 and 12 indicate an input/output terminal, a control terminal, an input terminal, an input buffer and an electrostatic protection circuit respectively. The input/output terminal 1, control terminal 2, input terminal 3, output buffer circuit 10*a*, input buffer 11 and electrostatic protection circuit 12 constitute the input/output circuit of the semiconductor integrated circuit device.

An internal circuit is electrically connected to the input/output terminal 1 through the input buffer 11. Further, the control terminal 2 for receiving a control signal IN1 having a first potential, which is delivered from the internal circuit, and the input terminal 3 for receiving an output signal IN2 having a second potential, which is delivered from the internal circuit, are electrically connected to the input/output terminal 1 via the output buffer circuit 10*a*. The control terminal 2 and the input terminal 3 are electrically connected to the signal level conversion circuit 8.

Further, the electrostatic protection circuit 12 is electrically connected to the input/output terminal 1. The signal level conversion circuit 8 outputs level-converted first and second signals based on binary logic to the input/output control circuit 7*a* through connecting points N5 and N6. The input/output control circuit 7*a* outputs these signals to the buffer circuit 9*a* through connecting points N7 and N8 respectively.

When an external input signal of a high potential is inputted from the input/output terminal 1 to the electrostatic protection circuit 12, the electrostatic protection circuit 12 is brought to a low impedance state. When an external input signal of a low potential or an operating voltage is inputted to the electrostatic protection circuit 12, the electrostatic protection circuit 12 is brought to a high impedance state. Thus, the electrostatic protection circuit 12 serves so as to make a protection against electrostatic breakdown of the input/output circuit. The electrostatic protection circuit 12 is formed on a substrate in the form of a structure wherein, for example, resistive elements using junction diodes, diffusion regions and polysilicon layers are provided in combination.

Referring to FIG. 1, "$V_{DD1}$ ←" indicates a voltage range of a circuit driven by a first source potential $V_{DD1}$ corresponding to a source voltage for the internal circuit. "→ $V_{DD2}$" indicates a voltage range of a circuit driven by a second source potential $V_{DD2}$. Further, first source potential points 4 supply the first source potential $V_{DD1}$. Second source potential points 5 supply the second source potential $V_{DD2}$. Respective ground potential points 6 supply a ground potential GND. Here, $V_{DD2}>V_{DD1}>GND$.

A circuit of the input buffer 11 comprises circuits for respectively converting levels of external input signals whose "H" and "L" levels are defined by the second source potential $V_{DD2}$ and the ground potential GND, to levels of signals whose "H" and "L" levels are defined by the first source potential $V_{DD1}$ and the ground potential GND, and an input driver circuit.

The output buffer circuit 10*a* comprises the signal level conversion circuit 8, the input/output control circuit 7*a* and the buffer circuit 9*a*. Thus, the control terminal 2 and the input terminal 3 are electrically connected to the signal level conversion circuit 8.

The signal level conversion circuit 8 is divided into the former half 8*a* which operates at the first source voltage $V_{DD1}$ and the latter half 8*b* which operates at the second source voltage $V_{DD1}$. The former half 8*a* comprises PMOS transistors Q1 and Q7 and NMOS transistors Q2 and Q8 respectively constituting inverters, and NMOS transfer gates Q3 and Q9. The latter half 8*b* comprises PMOS transistors Q4, Q5, Q10 and Q11 respectively constituting latch types, and NMOS transistors Q6 and Q12.

Gate electrodes of the PMOS transistor Q1 and NMOS transistor Q2, which constitute the inverter, are electrically connected to the control terminal 2 for receiving the control signal IN1 from the inside. Similarly, gate electrodes of the PMOS transistor Q7 and NMOS transistor Q8, which constitute the inverter, are electrically connected to the input terminal 3 for receiving the output signal IN2 from the inside.

A source electrode of the NMOS transfer gate Q3 is electrically connected to a connecting point N1 corresponding to each of drain electrodes of the PMOS transistor Q1 and the NMOS transistor Q2. A gate electrode of the NMOS transfer gate Q3 is electrically connected to the first source potential point 4. A source electrode of the NMOS transfer gate Q9 is electrically connected to a connecting point N2 corresponding to each of drain electrodes of the PMOS transistor Q7 and the NMOS transistor Q8. A gate electrode of the NMOS transfer gate Q9 is electrically connected to the first source potential point 4.

A source electrode of the PMOS transistor Q5 constituting the latch type, is electrically connected to the second source potential point 5, whereas a gate electrode thereof is electrically connected to a connecting point N3 corresponding to a drain electrode of the NMOS transfer gate Q3. A source electrode of the NMOS transistor Q6 is electrically connected to the ground potential point 6, whereas a gate electrode thereof is electrically connected to the connecting point N3. A source electrode of the PMOS transistor Q4 is electrically connected to the second source potential point 5, whereas a gate electrode thereof is electrically connected to the connecting point N5 corresponding to each of drain electrodes of the PMOS transistor Q5 and NMOS transistor Q6.

A source electrode of the PMOS transistor Q11 constituting the latch type, is electrically connected to the second source potential point 5, whereas a gate electrode thereof is electrically connected to a connecting point N4 corresponding to a drain electrode of the NMOS transfer gate Q9. A source electrode of the NMOS transistor Q12 is electrically connected to the ground potential point 6, whereas a gate electrode thereof is electrically connected to the connecting point N4. A source electrode of the PMOS transistor Q10 is electrically connected to the second source potential point 5, whereas a gate electrode thereof is electrically connected to the connecting point N6 corresponding to each of drain electrodes of the PMOS transistor Q11 and NMOS transistor Q12.

The input/output control circuit 7*a* comprises an inverter gate G3, a two-input NAND gate G5, and a two-input NOR gate G4 and constitutes a tristate control type input/output circuit. An input terminal of the inverter gate G3 is electrically connected to the connecting point N5. A first input terminal of the two-input NAND gate G5 is electrically connected to the connecting point N5. A second input terminal thereof is electrically connected to the connecting point N6. Incidentally, the tristate control type input/output circuit is one for controlling the output of the final stage of the connected buffer circuit so that the output thereof can be brought to a high impedance state other than the "H" and "L" levels.

The buffer circuit 9*a* comprises inverter gates G6 through G9 each having a CMOS structure, and the push-pull circuit 13 having the final stage composed of the PMOS transistor Q13*a* and the NMOS transistor Q14.

The former half 8*a* (including an inverter gate composed of the PMOS transistor Q1 and NMOS transistor Q2, the NMOS transistor Q3, an inverter gate composed of the PMOS transistor Q7 and NMOS transistor Q8, and the NMOS transfer gate Q9) of the signal level conversion circuit 8 is activated by being supplied with the first source potential $V_{DD1}$ and the ground potential GND. On the other hand, the latter half 8*b* (including the PMOS transistors Q4, Q5, Q10 and Q11 constituting the latch type level conversion circuit and the NMOS transistors Q6 and Q12) of the signal level conversion circuit 8, the input/output control circuit 7*a* and the buffer circuit 9*a* are activated by being supplied with the second source potential $V_{DD1}$ and the ground potential GND.

The signal level conversion circuit 8 has two types of signal transmission paths. One of them is a signal transmission path of a control signal system for receiving the control signal IN1 delivered from the internal circuit at the control terminal 2, converting the level of the signal to another in the course of signal transmission and outputting it to the connecting point N5. The other thereof is a signal transmission path of an output signal system for receiving the output signal IN2 delivered from the internal circuit at the input terminal 3, converting the level of the signal to another in the course of signal transmission in the same manner as described above and outputting it to the connecting point N6. Thus, the signal level conversion circuit 8 is composed of the two types of level conversion circuits of the control signal system and the output signal system. The level conversion circuit of the control signal system is composed of the PMOS transistors Q1, Q4 and Q5 and NMOS transistors Q2, Q3 and Q6. The level conversion circuit of the output signal system is comprised of the PMOS transistors Q7, Q10 and Q11 and NMOS transistors Q8, Q9 and Q12.

In order to avoid dielectric breakdown, gate insulating films of MOS transistors including the PMOS transistors Q4, Q5, Q10, Q11 and NMOS transistors Q3, Q6, Q9 and Q12 employed in a high source voltage system, MOS transistors constituting the input/output control circuit 7*a*, and the PMOS transistor Q13*a* and NMOS transistor Q14 constituting the buffer circuit 9*a* are formed so as to be thicker in thickness than gate insulating films of the PMOS transistors Q1 and Q7 and NMOS transistors Q2 and Q8 employed in a low source voltage system.

In the buffer circuit 9*a*, an input terminal of the inverter gate G6 is electrically connected to the input/output control circuit 7*a* through the connecting point N7. An input terminal of the inverter gate G8 is electrically connected to an output terminal of the inverter gate G6. An output terminal of the inverter gate G8 is electrically connected to a gate electrode of the PMOS transistor Q13*a* through a connecting point N9. Namely, the inverter gates of even-numbered stages exist between the connecting point N7 and the connecting point N9. A potential corresponding to the same logic as that corresponding to a potential supplied to the connecting point N7 is supplied to the gate electrode of the PMOS transistor Q13*a* through the connecting point N9.

On the other hand, an input terminal of the inverter gate G7 is electrically connected to the input/output control circuit 7*a* through the connecting point N8. An input terminal of the inverter gate G9 is electrically connected to an output terminal of the inverter gate G7. An output terminal of the inverter gate G9 is electrically connected to a gate electrode of the NMOS transistor Q14 through a connecting point N10. Namely, the inverter gates of even-numbered stages exist between the connecting point N8 and the connecting point N10. A potential corresponding to the same logic as that corresponding to a potential supplied to the connecting point N8 is supplied to the gate electrode of the NMOS transistor Q14 through the connecting point N10.

The operation of the circuit constructed as described above will next be described.

The semiconductor integrated circuit device having the output buffer circuit shown in FIG. 1 transmits a signal from the internal circuit of an LSI to an electronic device provided outside the LSI while performing signal level conversion. Namely, the signal supplied from the internal circuit of the LSI activated by the first source system supplied with the first source potential $V_{DD1}$ and the ground potential GND is subjected to the level conversion. The level-converted signal is supplied to the device provided outside the LSI activated by the second source system supplied with the second source potential $V_{DD1}$ and the ground potential GND.

The operation of the signal level conversion circuit 8 will first be described. The overall operation of the output buffer circuit of the first embodiment will next be described. As described above, the signal level conversion circuit 8 has the two level conversion circuits of the control signal system and the output signal system, which are composed of the same elements of structure. Thus, since these level conversion circuits are identical in operation to each other singly, the function and operation of the circuit of one output signal system will be described as an illustrative example.

If an "H" level signal (first source potential $V_{DD1}$ level) is inputted to the input terminal 3 when the inverter composed of the PMOS transistor Q7 and NMOS transistor Q8 activated at the first source potential $V_{DD1}$ is directly connected to the inverter composed of the PMOS transistor Q11 and NMOS transistor Q12 activated at the second source potential $V_{DD2}$, i.e., when the NMOS transistor Q9 and the PMOS transistor Q10 are not provided, then the output of the pre-stage inverter operating at the first source potential $V_{DD1}$ results in the "L" level (ground potential GND). The output of the post-stage inverter activated at the second source potential $V_{DD1}$ in response to this level results in the "H" level (second source potential $V_{DD2}$). No problem arises in this case. The "H" level signal is level-converted from the first source potential $V_{DD1}$ level to the second source potential $V_{DD2}$ level, so that the converted level is outputted from the input terminal 3 to the connecting point N6.

The problem arises when the "L" level signal is inputted to the input terminal 3. In this case, the pre-stage inverter outputs the "H" level (first source potential $V_{DD1}$ level). The post-stage inverter has a problem in that although the NMOS transistor Q12 is turned on, the PMOS transistor Q11 cannot be perfectly turned off because VGS ($V_{DD2}-V_{DD1}$)>VTP (VTH of PMOS transistor Q11), a current flows from the second source potential $V_{DD2}$ to the ground potential GND. In order to deal with the problem, the PMOS transistor Q10 serves so as to increase the potential at the connecting point N4 to the "H" level ($V_{DD2}$ level) in response to the "L" level output of the post-stage inverter.

Incidentally, the ratio (gate width W) between the sizes of the PMOS transistor Q11 and NMOS transistor Q12 constituting the post-stage inverter is set so as to satisfy WQ12>WQ11. This intends to further facilitate the outputting of the "L" level by the pull operation between the transistors Q11 and Q12 since the NMOS transistor Q12 is turned on and the PMOS transistor Q11 is also turned on if the potential at the connecting point N4 is at the "H" level ($V_{DD1}$ level). Thus, the PMOS transistor Q10 is turned on to thereby increase the potential at the connecting point N4 from $V_{DD1}$ to $V_{DD2}$ so as to satisfy $V_{GS}<V_{TP}$. Thus, the PMOS transistor Q11 is turned off.

Further, a problem arises in that when the PMOS transistors Q7 and Q10 are both turned on if the NMOS transistor Q9 is not provided, a current flows from the second source potential $V_{DD2}$ supply point 5 to the first source potential $V_{DD1}$ supply point 4. Thus, the NMOS transistor Q9 has the function of avoiding the problem owing to the insertion of the NMOS transistor Q9. At this time, the NMOS transistor Q9 remains off because no $V_{GS}$ is applied. Therefore, no current flows from the second source potential $V_{DD2}$ supply point 5 to the first source potential $V_{DD1}$ supply point 4.

The entire circuit operation of the first embodiment will next be described.

In the normal operating state, the first source potential $V_{DD1}$ and the second source potential $V_{DD2}$ are both applied to the circuit. Thus, operations of the circuit shown in FIG. 1 are successively as follows:

A description will first be made of the case in which the control signal IN1 is of an "L" level.

When the output signal IN2 is "L" in level, the signal level conversion circuit 8 outputs the "L" level to both the connecting points N5 and N6. In response to this signal, the input/output control circuit 7*a* placed in the next stage outputs an "H" level signal to the connecting point N7 after the "L" level has been inputted to each of the first input terminal (connecting point N5) of the NAND gate G5 and the second input terminal (connecting point N6) thereof. Further, the inverter G3 receives the "L" level signal at the input terminal (connecting point N5) and outputs an "H" level therefrom. The NOR gate G4 receives the "H" level output of the inverter G3 at a first input terminal thereof and inputs the "L" level signal at a second input terminal (connecting point N6) thereof, thereby outputting an "L" level to the connecting point N8.

In the next-stage buffer circuit 9*a*, the inverter G6 receives the "H" level signal at the input terminal (connecting point N7) and outputs an "L" level therefrom. The inverter G8 subsequent to the inverter G6 outputs an "H" level therefrom. As a result, the connecting point N9 becomes the "H" level ($V_{DD2}$ level), so that the PMOS transistor Q13*a* is turned off. Further, the inverter G7 receives the "L" level at the input terminal N8 and outputs an "H" level therefrom. In response to this signal, the inverter G9 outputs an "L" level to the connecting point N10. As a result, the NMOS transistor Q14 is turned off. Therefore, the PMOS transistor Q13*a* and the NMOS transistor Q14 are both turned off so that the input/output terminal 1 is brought to a high impedance state as seen from an external circuit.

When the output signal IN2 is "H" in level, the signal level conversion circuit 8 outputs an "L" level to the connecting point N5 and outputs an "H" level to the connecting point N6. In response to this signal, the input/output control circuit 7a placed in the next stage outputs an "H" level signal to the connecting point N7 after the "L" level and the "H" level have been inputted to the first input terminal (connecting point N5) of the NAND gate G5 and the second input terminal (connecting point N6) thereof respectively. Further, the inverter G3 receives the "L" level signal at the input terminal (connecting point N5) and outputs an "H" level therefrom. The NOR gate G4 receives the "H" level output of the inverter G3 at the first input terminal thereof and receives the "H" level signal at the second input terminal (connecting point N6) thereof, thereby outputting an "L" level to the connecting point N8.

In the next-stage buffer circuit 9a, the inverter G6 receives the "H" level signal at the input terminal (connecting point N7) thereof and outputs an "L" level, which is inputted to the next inverter G8. The inverter G8 outputs an "H" level therefrom. As a result, the connecting point N9 becomes the "H" level ($V_{DD2}$ level), so that the PMOS transistor Q13a is turned off. Further, the inverter G7 receives the "L" level at the input terminal N8 thereof and outputs an "H" level. In response to this signal, the next inverter G9 outputs an "L" level to the connecting point N10. As a result, the NMOS transistor Q14 is turned off. Therefore, the PMOS transistor Q13a and the NMOS transistor Q14 are both turned off so that the input/output terminal 1 is brought to a high impedance state as viewed from an external circuit.

A description will next be made of the case in which the control signal IN1 is "H" in level.

When the output signal IN2 is "L" in level, the signal level conversion circuit 8 outputs an "H" level to the connecting point N5 and outputs an "L" level to the connecting point N6. In response to this signal, the input/output control circuit 7a placed in the next stage receives the "H" level at the first input terminal (connecting point N5) of the NAND gate G5 and receives the "L" level at the second input terminal (connecting point N6), thereby outputting an "H" level signal to the connecting point N7. Further, the inverter G3 receives the "H" level signal at the input terminal (connecting point N5) and outputs an "L" level. The NOR gate G4 receives the "L" level output of the inverter G3 at the first input terminal thereof and receives the "L" level signal at the second input terminal (connecting point N6), thereby outputting an "H" level to the connecting point N8.

In the next-stage buffer circuit 9a, the inverter G6 receives the "H" level signal at the input terminal (connecting point N7) thereof and outputs an "L" level, which is inputted to the next inverter G8. The inverter G8 outputs an "H" level therefrom. As a result, the connecting point N9 becomes the "H" level ($V_{DD2}$ level), so that the PMOS transistor Q13a is turned off. Further, the inverter G7 receives the "H" level at the input terminal N8 thereof and outputs an "L" level. In response to this signal, the inverter G9 outputs an "H" level to the connecting point N10. As a result, the NMOS transistor Q14 is turned on so that the input/output terminal is brought to an "L" level.

Next, when the output signal IN2 is "H" in level, the signal level conversion circuit 8 outputs an "H" level to the connecting point N5 and outputs an "H" level to the connecting point N6. In response to this signal, the input/output control circuit 7a placed in the next stage receives the "H" level at the first input terminal (connecting point N5) of the NAND gate G5 and receives the "H" level at the second input terminal (connecting point N6), thereby outputting an "L" level signal to the connecting point N7. Further, the inverter G3 receives the "H" level signal at the input terminal (connecting point N5) and outputs an "L" level therefrom. The NOR gate G4 receives the "L" level output of the inverter G3 at the first input terminal thereof and inputs the "H" level signal at the second input terminal (connecting point N6) thereof, thereby outputting an "L" level to the connecting point N8.

In the next-stage buffer circuit 9a, the inverter G6 receives the "L" level signal at the input terminal (connecting point N7) thereof and outputs an "H" level, which is inputted to the next inverter G8. The inverter G8 outputs an "L" level therefrom. As a result, the connecting point N9 results in the "L" level ($V_{DD2}$ level), so that the PMOS transistor Q13a is turned on. Further, the inverter G7 receives the "L" level at the input terminal N8 thereof and outputs an "H" level. In response to this signal, the next inverter G9 outputs an "L" level to the connecting point N10. As a result, the NMOS transistor Q14 is turned off so that the input/output terminal 1 is rendered "H" in level.

When the second source potential $V_{DD2}$ is turned on if the first source potential $V_{DD1}$ is in a turned-off state, the latter half of the signal level conversion circuit 8 activated at the second source level system transmits logical levels to the next-stage input/output control circuit 7a in a state in which the logical levels of the former half of the signal level conversion circuit 8 activated at the first source system have not been determined. At this time, a combination of logical levels applied to the connecting points N5 and N6 takes any of ("L", "L"), ("L", "H"), ("H", "H") and ("H", "L"). As a result, the input/output terminal 1 is brought to a high impedance state, a high impedance state, an "H" level output, and an "L" level output respectively. Further, both the PMOS transistors Q13a and Q14 constituting the buffer final stage 13 of the buffer circuit 9a are not turned on and hence no through currents flow from the second source potential $V_{DD2}$ to the ground potential GND.

According to the first embodiment as described above, since the first and second signals outputted from the signal level conversion circuit 8 are transmitted via the input/output control circuit of the tristate control type even if the logical combination of the first and second signals corresponds to any patterns, the two MOS transistors constituting the final stage of the next-stage buffer circuit are not turned on simultaneously. Thus, the present embodiment can bring about an advantageous effect in that since the through currents can be prevented from being generated in the transistors constituting the PMOS push-pull circuit of the final stage in the output buffer circuit, power consumption of the entire device can be reduced.

Second Embodiment

Figure 2:
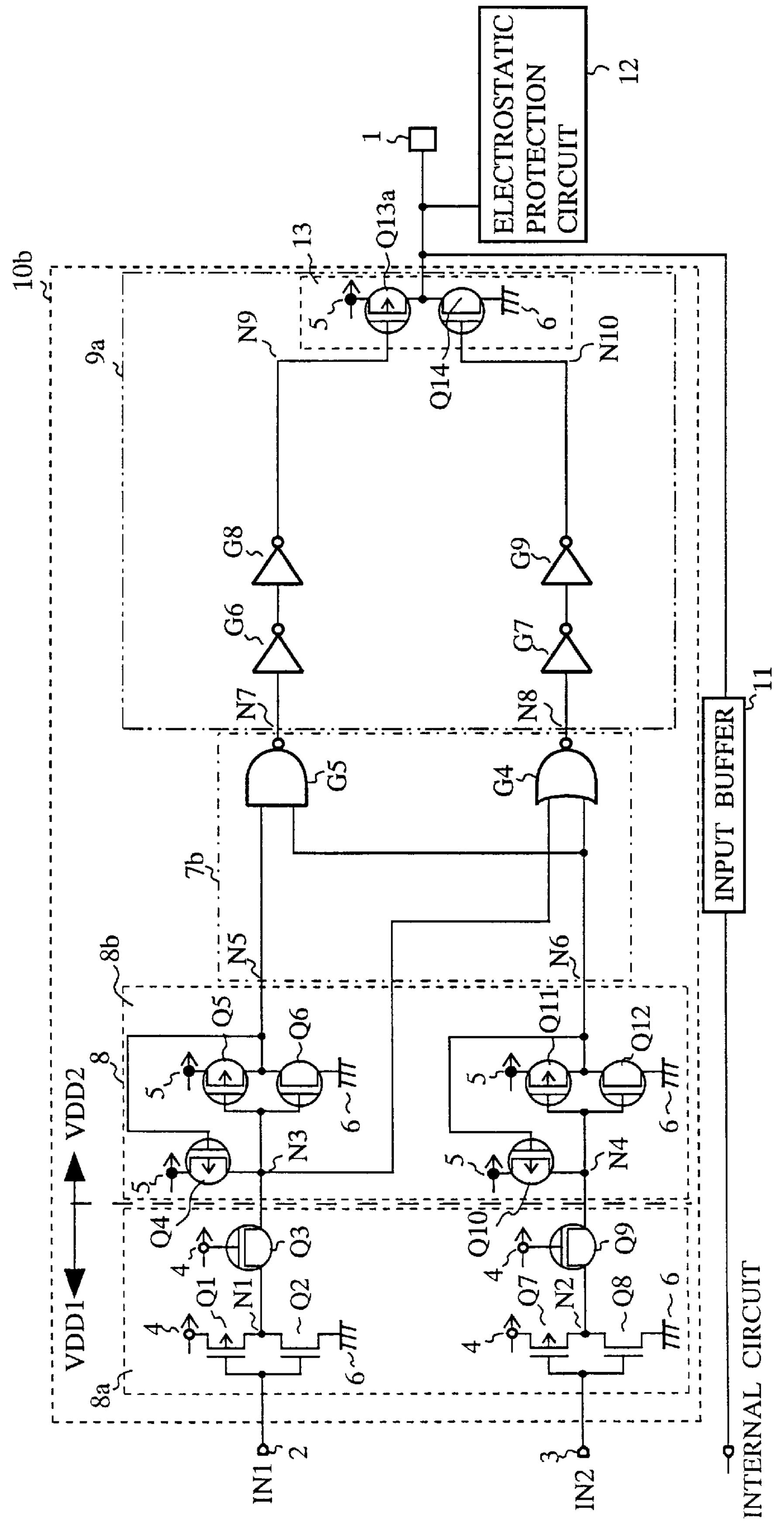
FIG. 2 is a circuit block diagram illustrating an output buffer circuit according to a second embodiment of the present invention.

FIG. 2 is a circuit diagram showing a configuration of an output buffer circuit according to a second embodiment and illustrates a configuration of an input/output circuit of a semiconductor integrated circuit device having a signal level converting function. The circuit illustrated in the present embodiment has a configuration in which the input/output control circuit 7a of the circuit illustrated in the first embodiment is replaced by an input/output control circuit 7b (logic circuit). Since other configurations are similar to those shown in FIG. 1, the same parts as those shown in FIG. 1 are identified by the same reference numerals and the description of certain common parts will be omitted.

The input/output control circuit 7b is different from the input/output control circuit 7a in that the former is not provided with the inverter gate G3 included in the latter and a first input terminal of an NOR gate G4 is electrically connected to a connecting point N3 of a pre-stage signal level conversion circuit 8. Thus, since a first signal outputted after a control signal IN1 has passed through a first conversion circuit, is not transmitted via the inverter gate G3 and the inverter composed of the transistors Q5 and Q6, no inversion occurs twice. Eventually, the present embodiment performs the same operation as the first embodiment from the viewpoint of a logical operation.

As described above, the second embodiment can bring about an advantageous effect in the same manner as the first embodiment in that since through currents can be prevented from being generated in transistors constituting a PMOS push-pull circuit of the final stage in the output buffer circuit, power consumption of the entire device can be reduced.

Third Embodiment

Figure 3:
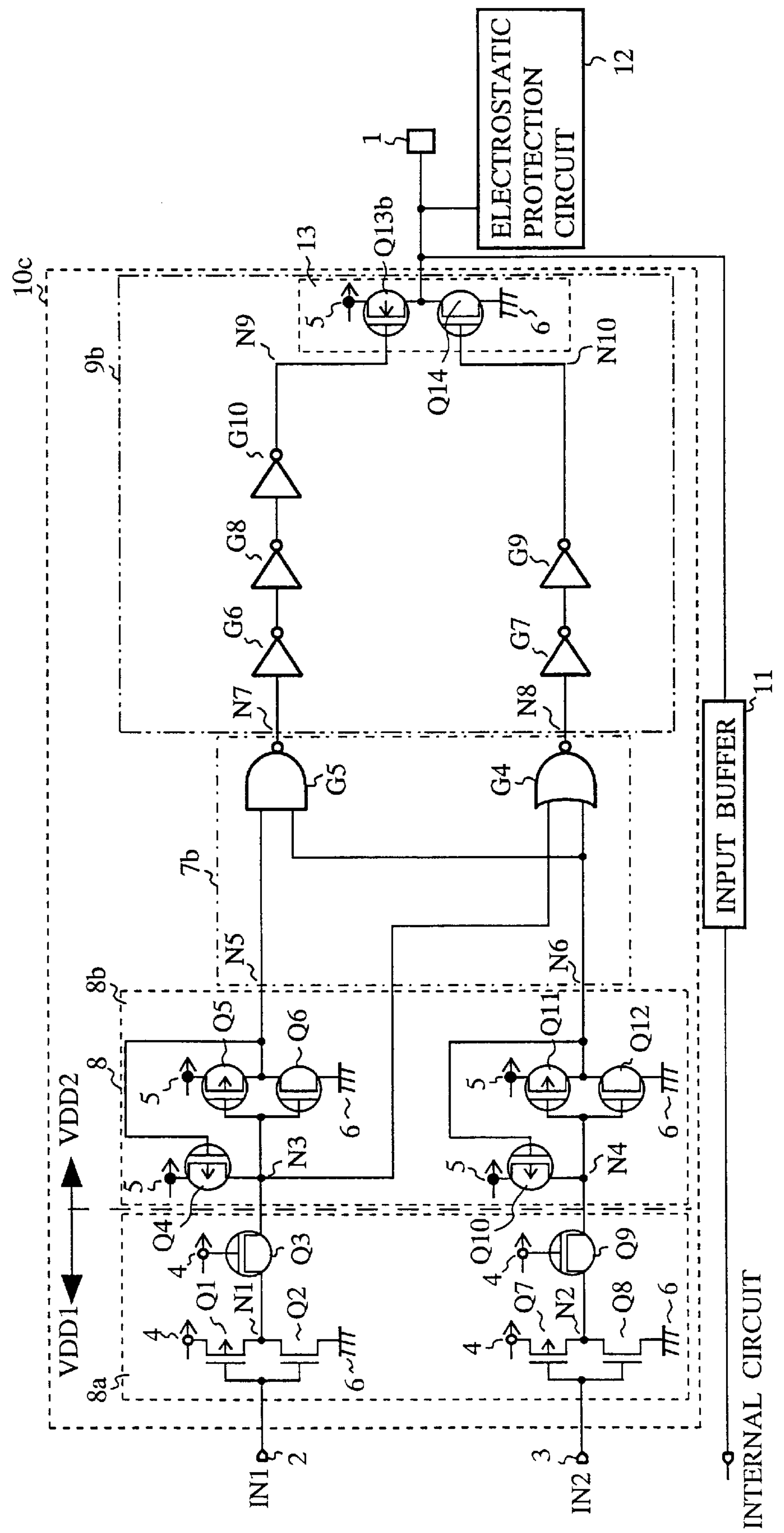
FIG. 3 is a circuit block diagram depicting an output buffer circuit according to a third embodiment of the present invention.

FIG. 3 is a circuit diagram showing a configuration of an output buffer circuit according to a third embodiment and illustrates a configuration of an input/output circuit of a semiconductor integrated circuit device having a signal level converting function. The circuit illustrated in the present embodiment has a configuration in which the buffer circuit 9*a* of the circuit illustrated in the second embodiment is replaced by a buffer circuit 9*b*. Since other configurations are similar to those shown in FIG. 1, the same parts as those shown in FIG. 1 are identified by the same reference numerals and the description of certain common parts will be omitted.

The buffer circuit 9*b* is composed of a push-pull circuit of a PMOS structure having inverter gates G6 through G10 and a final stage composed of two NMOS transistors Q13*b* and Q14. The buffer circuit 9*b* is different from the buffer circuit 9*a* in that the inverter gate G10 is additionally provided and the PMOS transistor Q13*a* is replaced by an NMOS transistor Q13*b*. Thus, since the NMOS transistor Q13*b* operates in reverse even if a signal is inverted by the inverter gate G10, the buffer circuit 9*b* performs the same operation as the first embodiment from the viewpoint of a logical operation.

As described above, the third embodiment can bring about an advantageous effect in the same manner as the first embodiment in that since through currents can be prevented from being generated in transistors constituting an NMOS push-pull circuit of the final stage in the output buffer circuit, power consumption of the entire device can be reduced.

Fourth Embodiment

Figure 4:
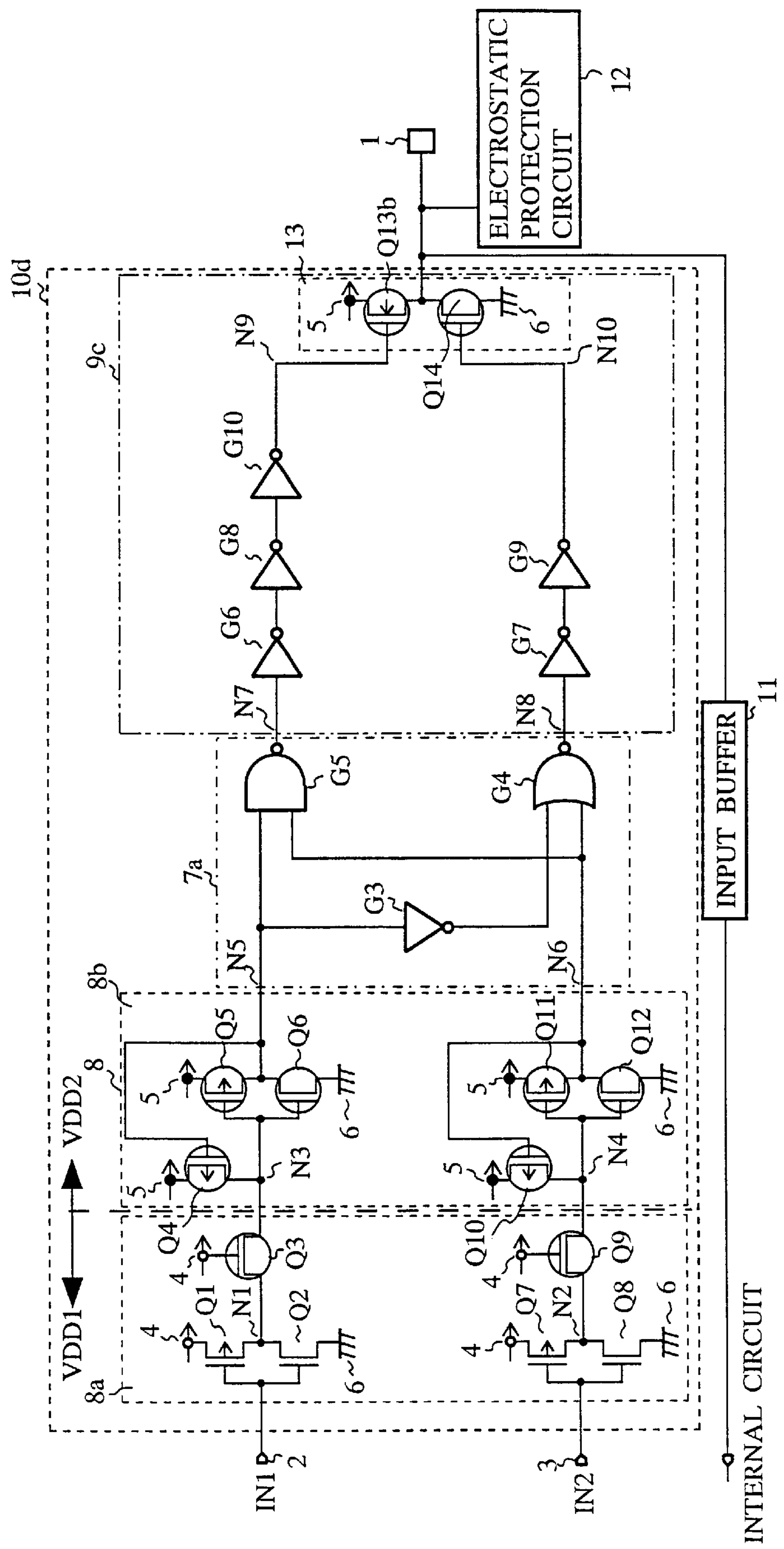
FIG. 4 is a circuit block diagram showing an output buffer circuit according to a fourth embodiment of the present invention.
Figure 5:
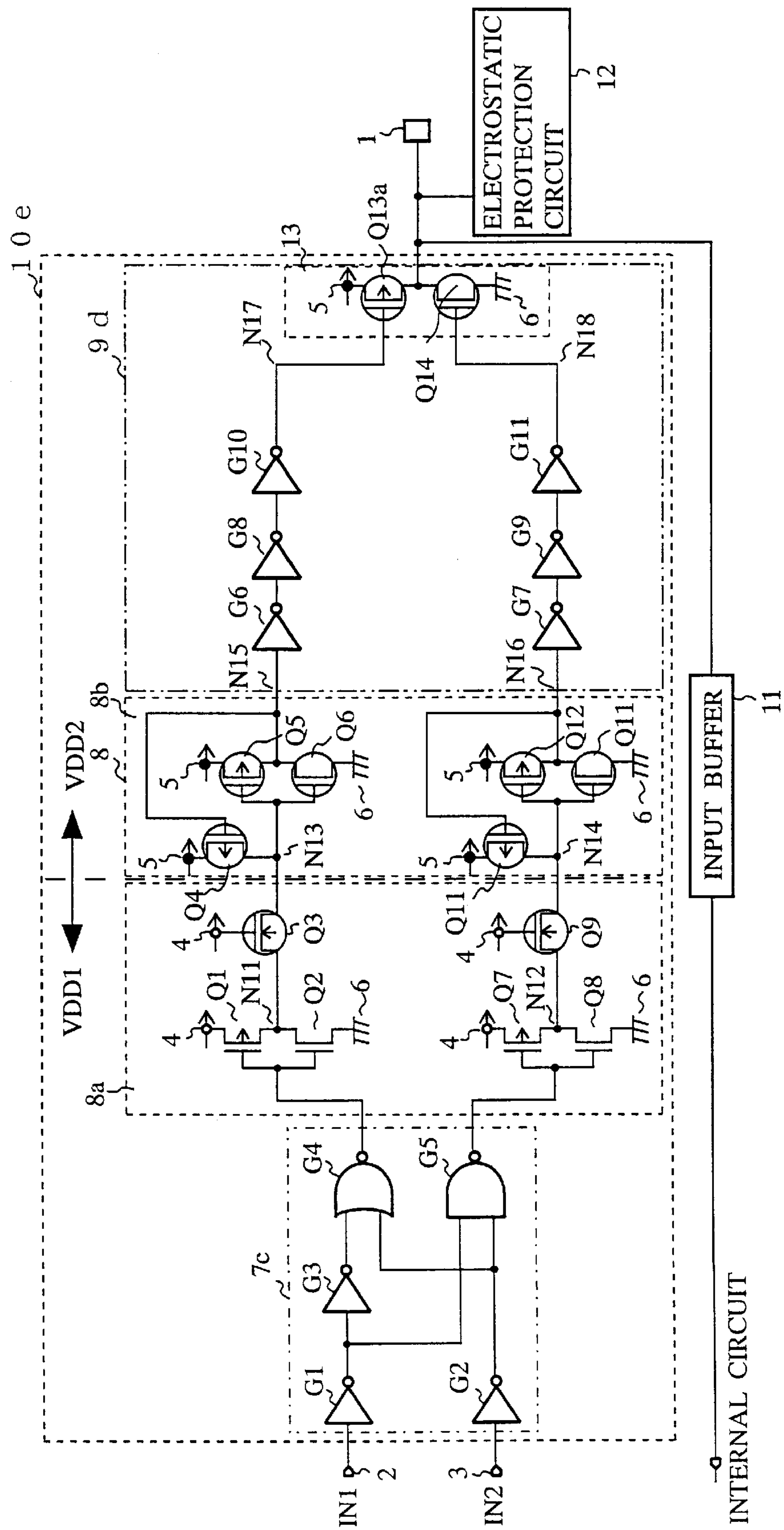
FIG. 5 is a circuit block diagram illustrating a conventional output buffer circuit.
Figure 6:
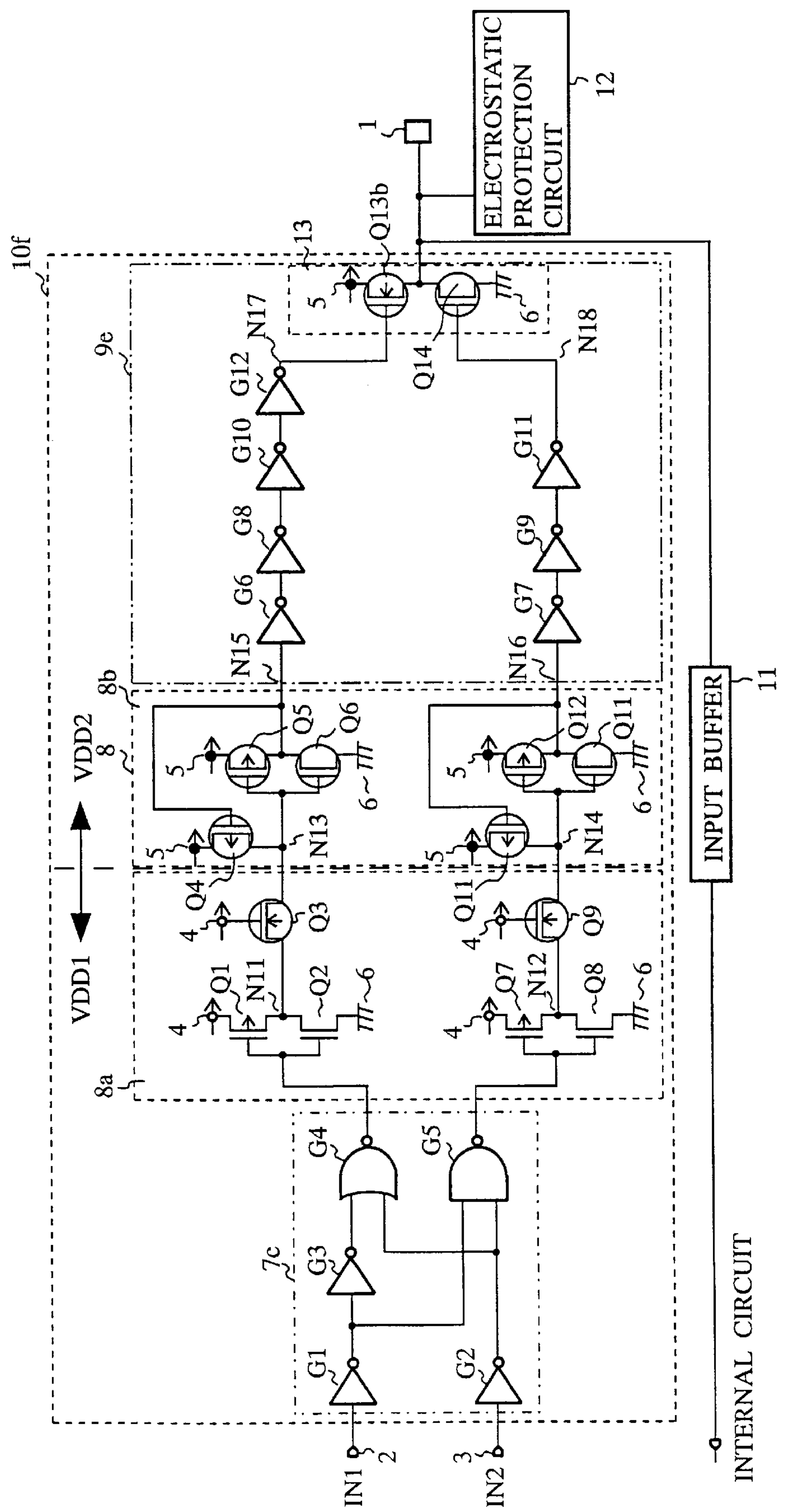
FIG. 6 is a circuit block diagram illustrating another conventional output buffer circuit.
Figure 7:
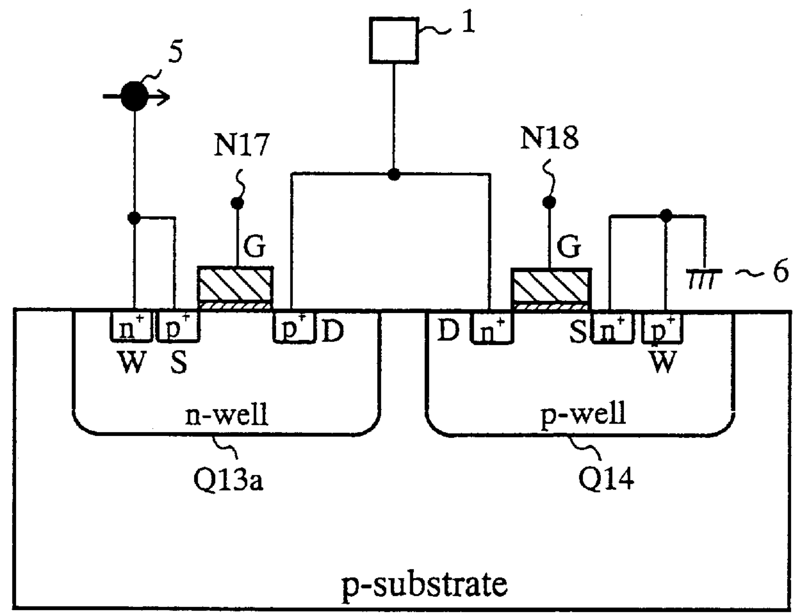
FIG. 7 is a cross-sectional view depicting a structure of transistors of a conventional buffer final stage.
Figure 8:
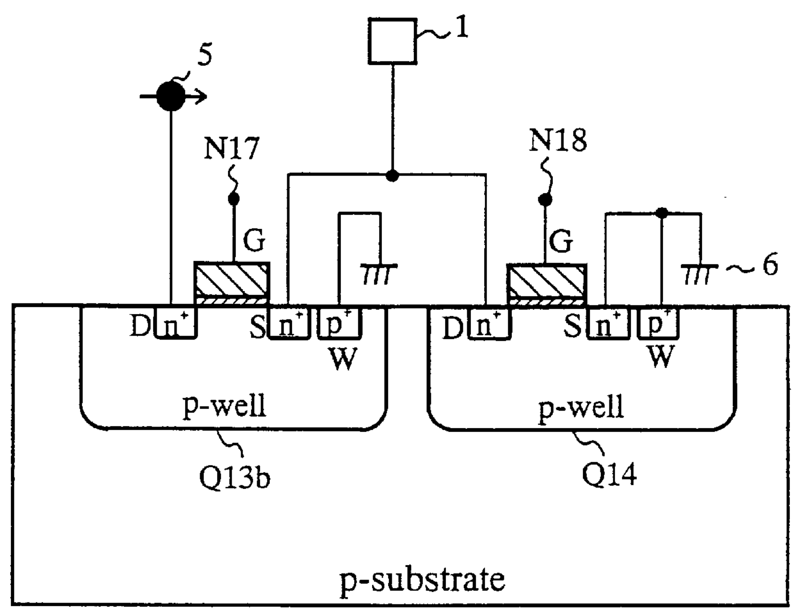
FIG. 8 is a cross-sectional view showing another structure of transistors of a conventional buffer final stage.

FIG. 4 is a circuit diagram showing a configuration of an output buffer circuit according to a fourth embodiment and illustrates a configuration of an input/output circuit of a semiconductor integrated circuit device having a signal level converting function. The circuit illustrated in the present embodiment has a configuration in which the buffer circuit 9*a* of the circuit illustrated in the first embodiment is replaced by a buffer circuit 9*c*. Since other configurations are similar to those shown in FIG. 1, the same parts as those shown in FIG. 1 are identified by the same reference numerals and the description of certain common parts will be omitted.

The buffer circuit 9*c* is composed of a push-pull circuit of a PMOS structure having inverter gates G6 through G10 each having a CMOS structure and a final stage composed of two NMOS transistors Q13*b* and Q14. The buffer circuit 9*c* is different from the buffer circuit 9*a* in that the inverter gate G10 is additionally provided and the PMOS transistor Q13*a* is replaced by the NMOS transistor Q13*b*. Thus, the buffer circuit 9*c* performs the same operation as the first embodiment from the viewpoint of a logical operation as described above.

As described above, the fourth embodiment can bring about an advantageous effect in the same manner as the first embodiment in that since through currents can be prevented from being generated in transistors constituting an NMOS push-pull circuit of the final stage in the output buffer circuit, power consumption of the entire device can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An output buffer circuit comprising:

a conversion circuit having first converting means for inputting a first potential and a second potential therein and converting the same into first and second signals based on binary logic in a first source voltage system, and second converting means for inputting the first and second signals therein and converting these signals into signal voltage levels corresponding to a second source voltage system;

a tristate control type logic circuit for computing the first and second signals outputted from said second converting means in the second source voltage system; and a push-pull circuit having field-effect transistors, said push-pull circuit being activated in the second source voltage system in response to the first and second signals outputted from said logic circuit so as to select and output any of three states.

2. An output buffer circuit according to claim 1, wherein said second converting means performs an operation based on the binary logic.

3. An output buffer circuit according to claim 1, wherein said tristate control type logic circuit comprises an inverter gate, a NAND gate and a NOR gate.

4. An output buffer circuit according to claim 1, wherein said push-pull circuit has an output final stage composed of a PMOS transistor and an NMOS transistor.

5. An output buffer circuit according to claim 1, wherein said push-pull circuit has an output final stage composed of two NMOS transistors.

6. An output buffer circuit comprising:

a conversion circuit having first converting means for inputting a first potential and a second potential therein and converting the same into first and second signals based on binary logic in a first source voltage system, and second converting means for inputting the first and second signals therein and converting these signals into signal voltage levels corresponding to a second source voltage system;

a tristate control type logic circuit for computing the first and second signals outputted from said first and second converting means in the second source voltage system; and a push-pull circuit having field-effect transistors, said push-pull circuit being activated in the second source voltage system in response to the first and second signals outputted from said logic circuit so as to select and output any of three states.

7. An output buffer circuit according to claim 6, wherein said second converting means performs an operation based on the binary logic.

8. An output buffer circuit according to claim 6, wherein said tristate control type logic circuit comprises a NAND gate and a NOR gate.

9. An output buffer circuit according to claim 6, wherein said push-pull circuit has an output final stage composed of a PMOS transistor and an NMOS transistor.

10. An output buffer circuit according to claim 6, wherein said push-pull circuit has an output final stage composed of two NMOS transistors.

* * * * *